United States Patent
Lavric et al.

(10) Patent No.: US 12,402,387 B2
(45) Date of Patent: *Aug. 26, 2025

(54) INTEGRATED CIRCUIT STRUCTURES INCLUDING A TITANIUM SILICIDE MATERIAL

(71) Applicant: Intel Corporation, Santa Clara, CA (US)

(72) Inventors: Dan S. Lavric, Beaverton, OR (US); Glenn A. Glass, Portland, OR (US); Thomas T. Troeger, Portland, OR (US); Suresh Vishwanath, Portland, OR (US); Jitendra Kumar Jha, Hillsboro, OR (US); John F. Richards, Portland, OR (US); Anand S. Murthy, Portland, OR (US); Srijit Mukherjee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/737,616

(22) Filed: Jun. 7, 2024

(65) Prior Publication Data
US 2024/0332392 A1 Oct. 3, 2024

Related U.S. Application Data

(63) Continuation of application No. 16/912,118, filed on Jun. 25, 2020, now Pat. No. 12,046,654.

(51) Int. Cl.
*H10D 64/62* (2025.01)
*H01L 21/28* (2025.01)
(Continued)

(52) U.S. Cl.
CPC ....... *H10D 64/62* (2025.01); *H01L 21/28088* (2013.01); *H01L 21/28518* (2013.01);
(Continued)

(58) Field of Classification Search
CPC .... H10F 64/62; H10F 30/6211; H10F 64/667; H01L 21/28088
See application file for complete search history.

(56) References Cited

U.S. PATENT DOCUMENTS 10,651,287 B2    5/2020  More
12,046,654 B2*   7/2024  Lavric ............... H10D 62/832
(Continued)

*Primary Examiner* — Christine A Enad
(74) *Attorney, Agent, or Firm* — Schwabe, Williamson & Wyatt P.C.

(57) ABSTRACT

Approaches for fabricating an integrated circuit structure including a titanium silicide material, and the resulting structures, are described. In an example, an integrated circuit structure includes a semiconductor fin above a substrate, a gate electrode over the top and adjacent to the sidewalls of a portion of the semiconductor fin. A titanium silicide material is in direct contact with each of first and second epitaxial semiconductor source or drain structures at first and second sides of the gate electrode. The titanium silicide material is conformal with and hermetically sealing a non-flat topography of each of the first and second epitaxial semiconductor source or drain structures. The titanium silicide material has a total atomic composition including 95% or greater stoichiometric $TiSi_2$.

20 Claims, 12 Drawing Sheets

(51) Int. Cl.
  *H01L 21/285* (2006.01)
  *H10D 30/01* (2025.01)
  *H10D 30/62* (2025.01)
  *H10D 62/13* (2025.01)
  *H10D 62/832* (2025.01)
  *H10D 64/66* (2025.01)

(52) U.S. Cl.
  CPC ....... *H10D 30/024* (2025.01); *H10D 30/6211* (2025.01); *H10D 62/151* (2025.01); *H10D 62/832* (2025.01); *H10D 64/667* (2025.01)

(56) References Cited

U.S. PATENT DOCUMENTS

| | | |
|---|---|---|
| 2005/0009338 A1 | 1/2005 | Sandhu |
| 2018/0248011 A1 | 8/2018 | Mehandru |
| 2019/0148522 A1* | 5/2019 | Wu .................. H01L 21/76832 257/365 |
| 2019/0165124 A1* | 5/2019 | More .................. H01L 29/665 |
| 2021/0175352 A1* | 6/2021 | Han .................. H01L 27/0924 |

* cited by examiner

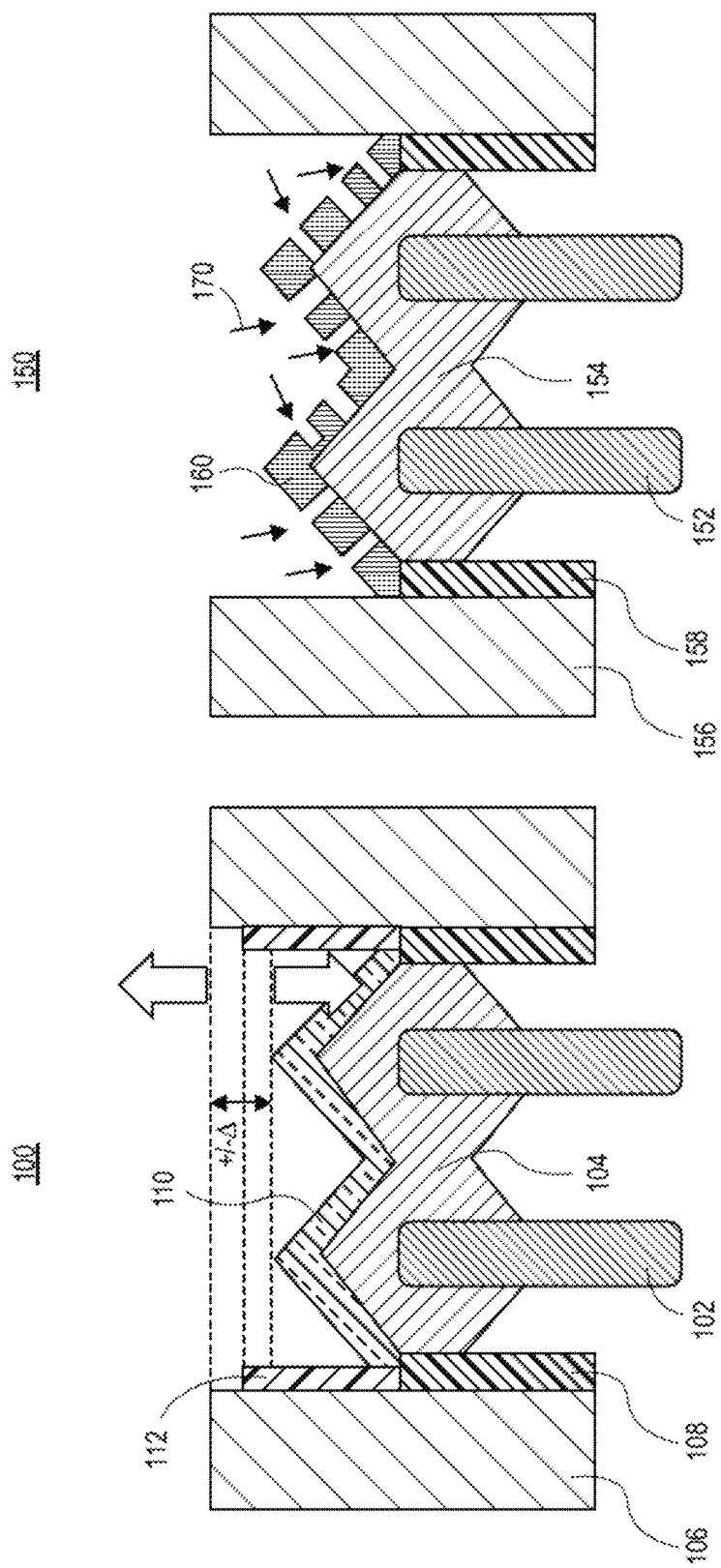

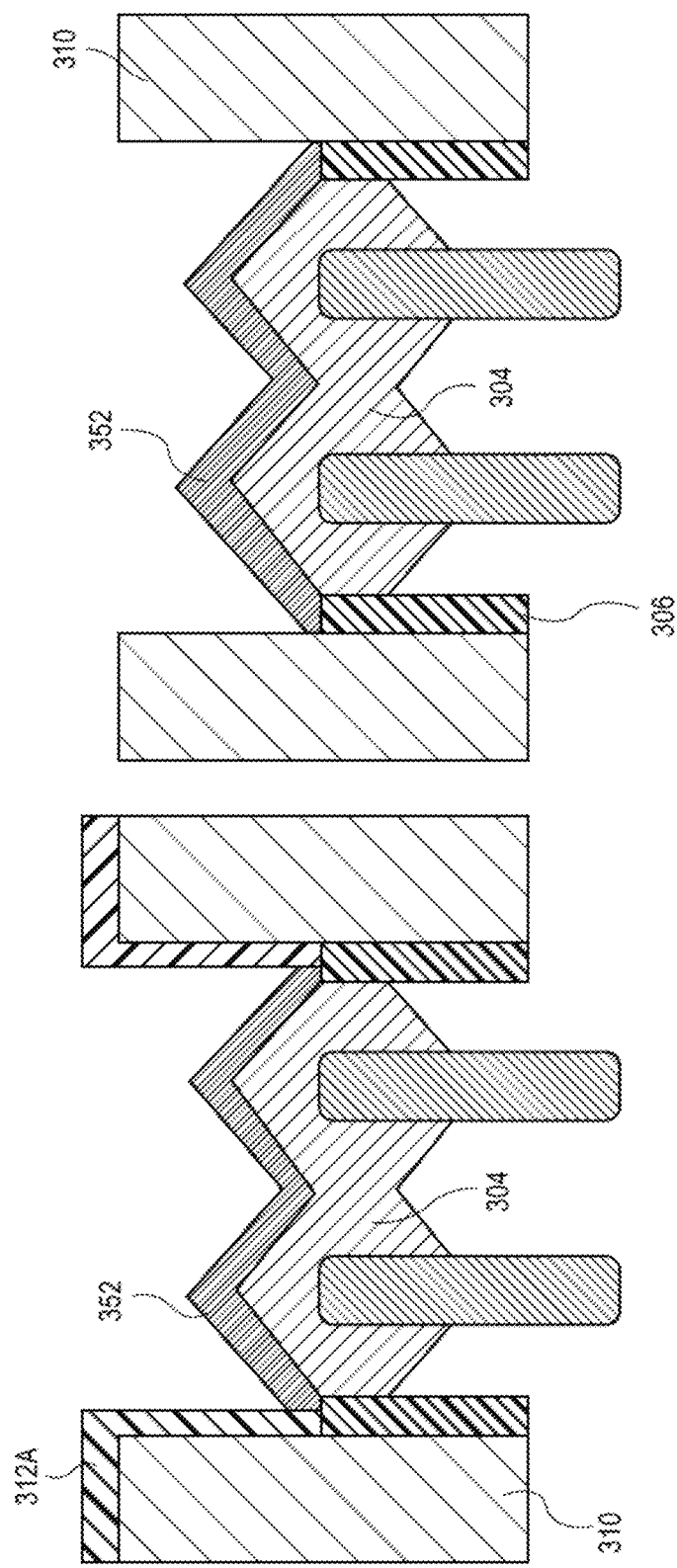

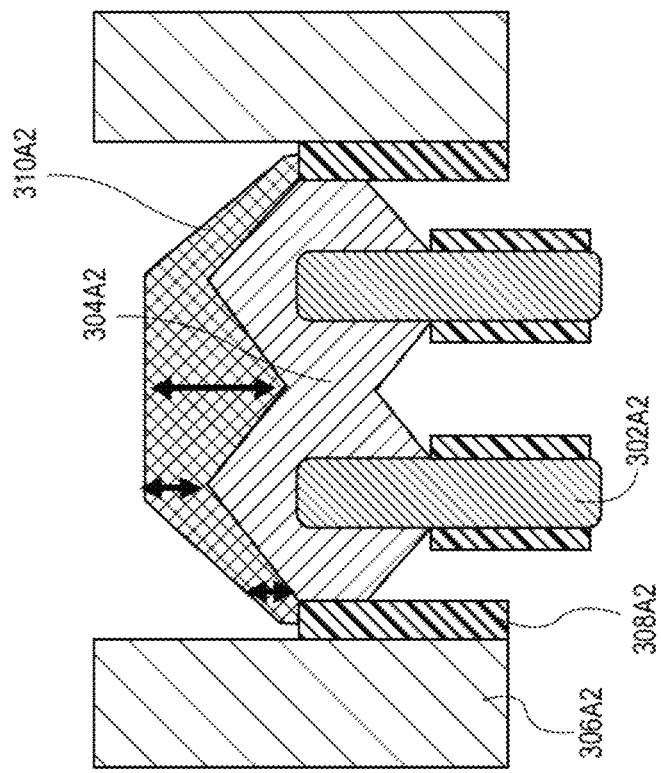
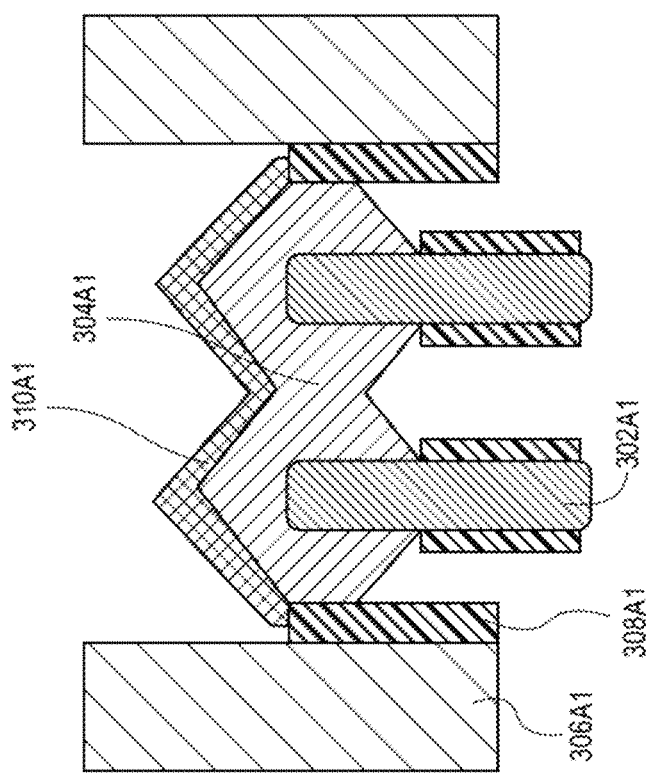
FIG. 3A1
FIG. 3A2

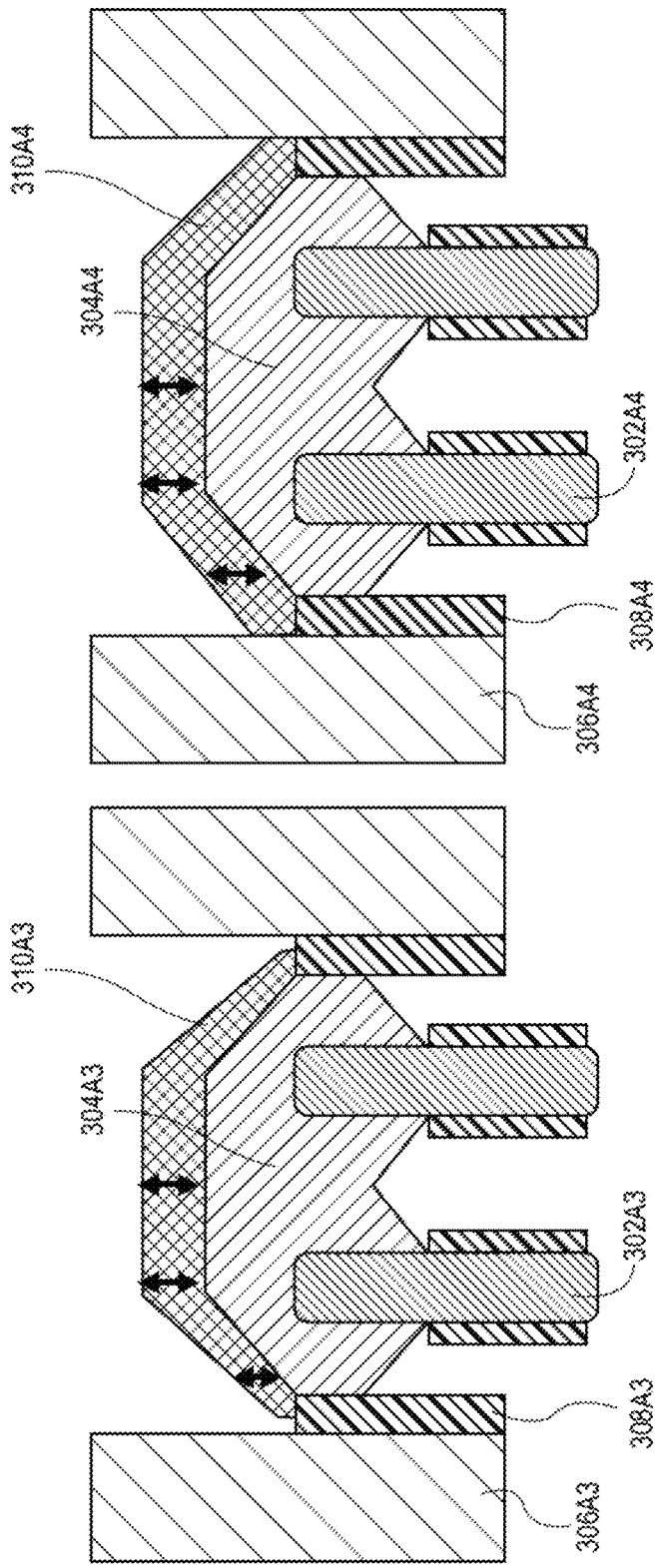

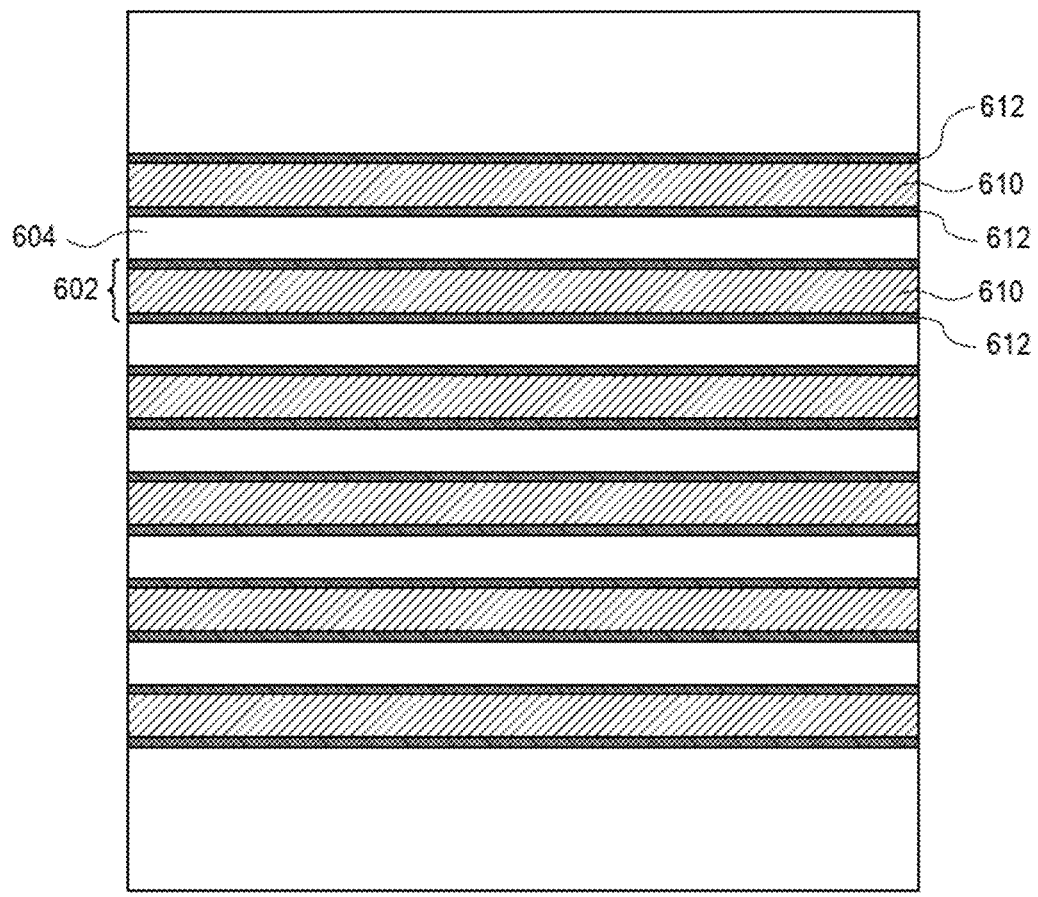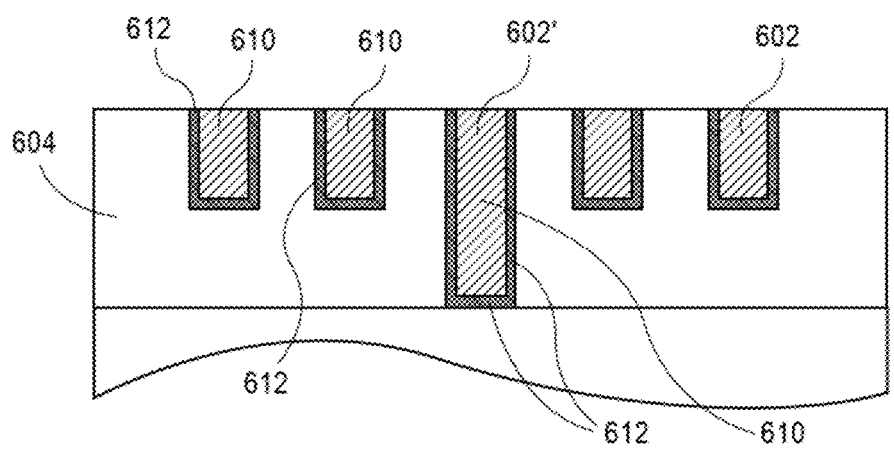
FIG. 6

INTEGRATED CIRCUIT STRUCTURES INCLUDING A TITANIUM SILICIDE MATERIAL

CROSS-REFERENCE TO RELATED APPLICATIONS

This application is a continuation of U.S. patent application Ser. No. 16/912,118, filed on Jun. 25, 2020, the entire contents of which is hereby incorporated by reference herein.

TECHNICAL FIELD

Embodiments of the disclosure are in the field of integrated circuit structures and, in particular, approaches for fabricating an integrated circuit structure including a titanium silicide material, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 1A illustrates a cross-sectional view taken through a source or drain region of an integrated circuit structure including a titanium mono-silicide (TiSi) layer on an epitaxial source or drain structure.

FIG. 1B illustrates a cross-sectional view taken through a source or drain region of an integrated circuit structure including a titanium di-silicide ($TiSi_2$) layer on an epitaxial source or drain structure.

FIGS. 3A-3E illustrate cross-sectional views taken through a source or drain region for various operations in a method of fabricating an integrated circuit structure including a titanium di-silicide ($TiSi_2$) layer on an epitaxial source or drain structure, in accordance with an embodiment of the present disclosure.

FIGS. 3A1-3A4 illustrate cross-sectional views of various structures including a high purity silicon cap thereon, for ultimate reaction with a titanium layer, in accordance with an embodiment of the present disclosure.

FIG. 6 illustrates a plan view and corresponding cross-sectional view of a metallization layer of an integrated circuit structure, in accordance with an embodiment of the present disclosure.

DESCRIPTION OF THE EMBODIMENTS

Figures 2A, 2B:
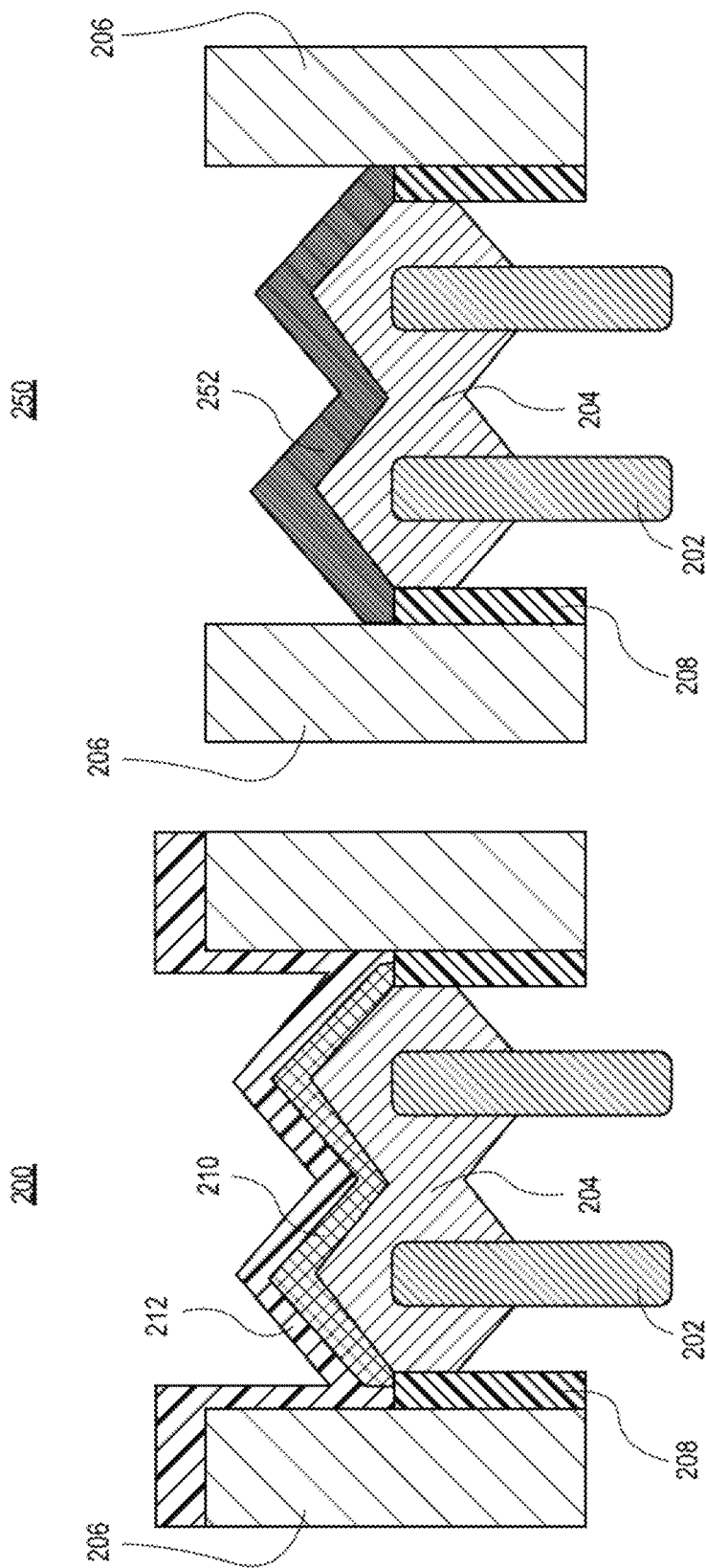
FIGS. 2A and 2B illustrate cross-sectional views taken through a source or drain region for various operations in a method of fabricating an integrated circuit structure including a titanium di-silicide ($TiSi_2$) layer on an epitaxial source or drain structure, in accordance with an embodiment of the present disclosure.

Approaches for fabricating an integrated circuit structure including a titanium silicide material, and the resulting structures, are described. In the following description, numerous specific details are set forth, such as specific material and process regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to the use of titanium di-silicide ($TiSi_2$) material layers for features of integrated circuit structures. Embodiments may be applicable to or include high yield hermetic $TiSi_2$ self-aligned contacts for advanced CMOS transistors.

To provide context, industry wide Ti-based contact metallization relies on a low temperature (LT) titanium mono-silicide (TiSi) to fabricate low resistivity metal-semiconductor Schottky junctions post metal gate (MG) loop. The LT requirement is imposed by the necessity to maintain low VT/low leakage insulator gate (IG) in the metal gates that can be warranted only by involving low thermal budget anneals post-MG. However, the LT TiSi integration requires a Ti deposition and recess scheme which can drastically limit the overall contact process window when the distance between top of epitaxial structure (EPI) and top of a dielectric wall separating transistors is tight for low capacity design constraints. Since TiSi essentially does not exhibit wet etch selectivity to titanium (Ti), any Ti over-recess performed to avoid yield-destroying short defects (metal over wall when Ti is under-recessed) exposes the mono-silicide TiSi to a Ti recess wet etch chemistry creating open defects (etched TiSi) that are also yield limiters.

State-of-the-art deposition and recess schemes are typically associated with a very limited process window (very small±Δ recess margin to avoid open/shorts) for producing a high yield high volume manufacturing (HVM) process for CMOS structures that have dielectric walls between FIN-FET transistors (fin based transistors) or between gate all around transistors (nano-sheets or fork-sheet based transistors).

Standard post-MG Ti deposition and recess schemes involve blanket depositing a Ti layer after NMOS and PMOS contacts have been opened post-MG. A low temperature (LT) anneal is applied to make a TiSi mono-silicide. The LT anneal temperature has to be sufficiently high to fabricate a silicide but sufficiently low (450 C-550 C) such that it will not increase a metal gate threshold voltage VT and leakage IG. A carbon hardmask (CHM) layer is deposited and then dry etch recessed in between the top of the wall and the top of the TiSi. A standard wet etch chemistry is then applied to remove any exposed Ti above the CHM recess line. A standard ash is finally applied that removes the CHM above the silicide. However, the CHM recess and hence the Ti recess must land in the tight spacing (e.g., <10 nm) in between the top of the wall and the top of the Ti mono-silicide. Small (e.g., <5 nm) under-recessed CHM can leave Ti metal on top of the wall leading to shorts. Small (e.g., <5 nm) over-recessed CHM can expose Ti mono-silicide TiSi to a Ti wet etch chemistry leading to silicide etch out/opens. CHM recess variability is compounded with Ti wet etch variability and can lead to a very limited contact process margin for HVM CMOS processing, as described in association with FIG. 1A.

FIG. 1A illustrates a cross-sectional view taken through a source or drain region of an integrated circuit structure including a titanium mono-silicide (TiSi) layer on an epitaxial source or drain structure.

Referring to FIG. 1A, an integrated circuit structure 100 includes silicon fins 102 having silicon or silicon germanium epitaxial source or drain structures 104 thereon (depicted as merged). The silicon or silicon germanium epitaxial source or drain structures 104 are confined between dielectric walls 106, such as gate end-cap dielectric walls, which may include a dielectric spacer 108 thereon. A titanium mono-silicide (TiSi) layer 110 is on the silicon or silicon germanium epitaxial source or drain structures 104. As depicted, a residual titanium layer 112 may remain on the sidewall as a result of it being covered/protected by the CHM during the CHM Recess process. The dashed lines represent a narrow process margin delta, where recessing that stops above the top dashed line (up arrow) can lead to shorts, and recessing that extends below the bottom dashed line (down arrow) can lead to opens.

Alternative approaches include a pre-MG Ti di-silicide TiSi$_2$ formation plus Ti etch back scheme. In an example, a Ti layer is blanket deposited on a wafer immediately after NEPI (Si:P) and PEPI (SiGe:B) have been selectively deposited in the source or drain regions. A high temperature (HT) anneal (e.g., 725 C-1000 C) is applied to form a Ti di-silicideTiSi$_2$ phase that is highly resistant to a wet etch. The TiSi$_2$ phase forms only when Ti is in direct contact with Si, that is, only above the exposed NEPI and PEPI; Ti will not form any silicide in the areas in which it is in contact with dielectrics. A standard wet etch chemistry (e.g., sulfuric-peroxide-mix) is applied to etch back unreacted Ti and leave in place only TiSi$_2$ above EPI. However, when Ti is directly deposited on top of NEPI or PEPI the quality/hermeticity of the resulting TiSi$_2$ can be rather poor because of the strong/negative interaction of TiSi$_2$ with phosphorus in NEPI (Si:P) and with germanium in PEPI (SiGe:B) during the HT anneals. P and Ge/B segregate at the TiSi$_2$ grain boundaries during TiSi$_2$ formation and are subsequently etched away during Ti wet etch back step. The resulting TiSi$_2$ can be discontinuous or fragmented and exposes the phos/Ge/B rich mono-silicide-EPI contact interface to direct attack by the Ti etch back chemistries which renders the contact very high resistance or OPEN, as described in association with FIG. 1B.

FIG. 1B illustrates a cross-sectional view taken through a source or drain region of an integrated circuit structure including a titanium di-silicide (TiSi$_2$) layer on an epitaxial source or drain structure.

Referring to FIG. 1B, an integrated circuit structure 150 includes silicon fins 152 having silicon or silicon germanium epitaxial source or drain structures 154 thereon (depicted as merged). The silicon or silicon germanium epitaxial source or drain structures 154 are confined between dielectric walls 156, such as gate end-cap dielectric walls, which may include a dielectric spacer 158 thereon. A titanium di-silicide (TiSi$_2$) layer 160 is on the silicon or silicon germanium epitaxial source or drain structures 154. As depicted, the titanium di-silicide (TiSi$_2$) layer 160 is poor quality and may be fragmented and include breaks at locations 170 which inhibit hermetic sealing of the silicon or silicon germanium epitaxial source or drain structures 154. Additionally, the silicon or silicon germanium epitaxial source or drain structures 154 may be depleted of silicon and susceptible to wet etch attack.

In accordance with one or more embodiments of the present disclosure, a pre-MG high quality/continuous/hermetic, high wet etch resistant TiSi$_2$ that forms only on top of NEPI/PEPI is used as a protective layer that prevents the silicide-EPI contact interface from being attacked during Ti etch back operation. In one embodiment, in the EPI mid-section, right after the standard NEPI/PEPI deposition, a 6-20 nm Si cap is deposited in-situ on top of the EPI to prevent any oxide formation at the EPI-Si Cap interface. The Si Cap can have a very limited P, B or Ge contamination (e.g., Si purity>99.5%) and can be deposited selectively only on top of EPI and not anywhere else on the wafer). In an embodiment, a 3-10 nm Ti layer is subsequently deposited on top of the Si cap to ensure a Si:Ti thickness ratio of, e.g., 2.2-2.4 to make possible forming of a high quality/hermetic TiSi$_2$ that is in direct contact with the EPI. Since the Si cap lacks significant P, B or Ge contaminants, in one embodiment, the Ti di-silicide TiSi$_2$ formation is not hindered in any way, allowing the TiSi$_2$ grains to merge without any obstruction. As a result, a continuous, high quality/hermetic TiSi$_2$ layer can be formed that acts as a protective barrier against Ti etch back chemistry. In one embodiment, a flash high temperature 725-1000 C/10-100 msec forming gas anneal is then applied to the Si cap and Ti stack to form stoichiometric TiSi$_2$ phase formation only on top of NEPI/PEPI. A Ti wet etch back chemistry can then be applied on the whole wafer to remove un-reacted Ti everywhere else on the wafer except for the top of the EPI which is being protected by the continuous TiSi$_2$, such as described in FIGS. 2A and 2B).

In accordance with one or more embodiments of the present disclosure, an up-front high yield Ti silicide contact process is described. A high quality hermetic TiSi$_2$ EPI protective "crust" that ensures no open contacts during Ti etch back is described. A highly efficient wet etch back that removes un-reacted Ti everywhere else on the wafer ensuring no Ti metal shorts above a dielectric wall is described. Embodiments described may be implemented to bypass the need to do a low yield/low process window Ti deposition and recess scheme, providing a path for high yield/more robust process flow. In an embodiment, since NEPI/PEPI is encapsulated with protective TiSi$_2$ it therefore preserves phos in NEPI as well as B and Ge in PEPI (i.e., no dopant Phos/B or Ge loss) enabling high quality/low resistivity silicide-EPI interface. Embodiments may be implemented to greatly simplify a process flow enabling true self aligned contacts.

In an embodiment, a TiSi$_2$ layer described herein is a C49 or low resistivity C54 phase. Both TiSi$_2$ phases are highly wet etch selective and provide efficient EPI protection/hermeticity against Ti etch back attack avoiding open contacts. The TiSi$_2$ may cover EPI entirely and provide higher contact area/lower contact resistance since its formation is up-front/at EPI deposition prior to a MG loop rather than at trench contact (TCN) formation when contact area opening is spacer limited (smaller). The TiSi$_2$ may form in one anneal operation on both NEPI and PEPI or in separate anneal operations, one for each polarity. In an embodiment, the thickness of TiSi$_2$ may be the same for both NEPI and PEPI or different for each contact polarity. The TiSi$_2$ may be formed only on NEPI if a 'dual metal silicides' approach is used where the high temperature high quality/hermetic TiSi$_2$ is being generated first at EPI mid-section and then a subsequently standard low temperature NiPtGeSi is formed second on PEPI either at the EPI mid-section pre-MG or at standard TCN section post-MG.

FIGS. 2A and 2B illustrate cross-sectional views taken through a source or drain region for various operations in a method of fabricating an integrated circuit structure including a titanium di-silicide (TiSi$_2$) layer on an epitaxial source or drain structure, in accordance with an embodiment of the present disclosure.

Referring to FIG. 2A, a starting structure 200 includes silicon fins 202 having silicon or silicon germanium epitaxial source or drain structures 204 thereon (depicted as merged). The silicon or silicon germanium epitaxial source or drain structures 204 are confined between dielectric walls 206, such as gate end-cap dielectric walls, which may include a dielectric spacer 208 thereon. An epitaxial silicon layer 210 is formed on the silicon or silicon germanium epitaxial source or drain structures 204. A titanium layer 212 is formed on the structure including on the epitaxial silicon layer 210.

Referring to FIG. 2B, an integrated circuit structure 250 is formed upon annealing the structure 200 of FIG. 2A, and treatment with a selective wet etch cleaning process. The annealing forms a titanium di-silicide (TiSi$_2$) layer 252 directly on the silicon or silicon germanium epitaxial source or drain structures 204. The wet etch cleaning selectively removes unreacted portions of the titanium layer 212. In one embodiment, the titanium di-silicide (TiSi$_2$) layer 252 acts as a crust to protect the silicon or silicon germanium epitaxial source or drain structures 204 during the removal of unreacted portions of the titanium layer 212.

In another aspect, a pre-amorphization implant is performed on an epitaxial silicon cap prior to silicidation. In an example, FIGS. 3A-3E illustrate cross-sectional views taken through a source or drain region for various operations in a method of fabricating an integrated circuit structure including a titanium di-silicide (TiSi$_2$) layer on an epitaxial source or drain structure, in accordance with an embodiment of the present disclosure.

Figure 3A:
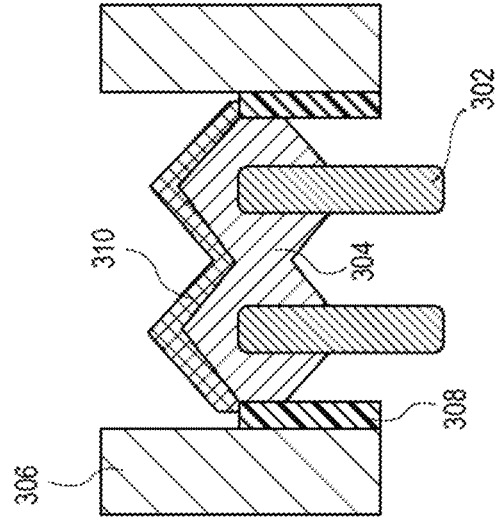

Referring to FIG. 3A, a starting structure includes silicon fins 302 having silicon or silicon germanium epitaxial source or drain structures 304 thereon (depicted as merged). The silicon or silicon germanium epitaxial source or drain structures 304 are confined between dielectric walls 306, such as gate end-cap dielectric walls, which may include a dielectric spacer 308 thereon. An epitaxial silicon layer 310 is formed on the silicon or silicon germanium epitaxial source or drain structures 304.

Figure 3B:
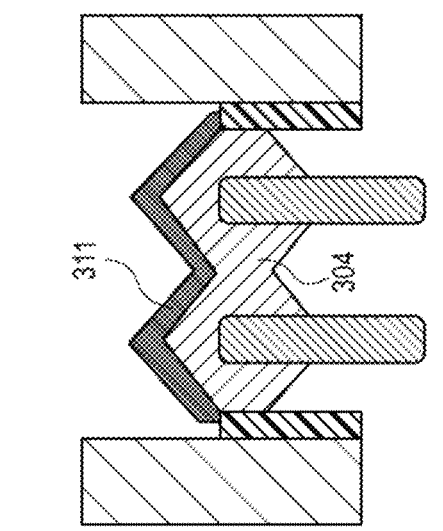
Figure 3C:
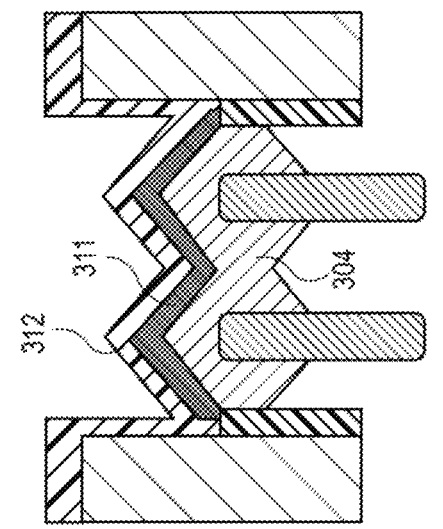

Referring to FIG. 3B, an implant process is performed to form an amorphized silicon layer 311. A titanium layer 312 is then formed on the structure of FIG. 3B, as is depicted in FIG. 3C. Referring to FIG. 3D, the structure of FIG. 3D is annealed to form a titanium di-silicide (TiSi$_2$) layer 352 directly on the silicon or silicon germanium epitaxial source or drain structures 304. Unreacted titanium portions may remain as a layer 312A. A wet etch cleaning is then performed to selectively remove the unreacted portions 312A of the titanium layer 212, as is depicted in FIG. 3E. In one embodiment, the titanium di-silicide (TiSi$_2$) layer 352 acts as a crust to protect the silicon or silicon germanium epitaxial source or drain structures 304 during the removal of unreacted portions 312A of the titanium layer 312.

In an embodiment, the titanium di-silicide (TiSi$_2$) layer 352 has a total atomic composition including 95% or greater stoichiometric TiSi$_2$. In a specific embodiment, the titanium di-silicide (TiSi$_2$) layer 352 has a total atomic composition including 98% or greater of stoichiometric TiSi$_2$. In an embodiment, the total atomic composition of the titanium di-silicide (TiSi$_2$) layer 352 further includes a non-zero amount but less than 1% of phosphorous, boron or germanium. In an embodiment, the titanium di-silicide (TiSi$_2$) layer 352 has a C49 crystalline phase or a C54 crystalline phase.

In an embodiment, the titanium di-silicide (TiSi$_2$) layer 352 has a thickness variation of 10% or less along a non-flat topography of underlying silicon or silicon germanium epitaxial source or drain structures 304. In an embodiment, the non-flat topography of each of the underlying epitaxial semiconductor source or drain structures includes a raised central portion and lower side portions (e.g., a raised central portion of one of the two merged source or drain regions depicted).

With reference to FIGS. 2A-2B and 3A-3E, in accordance with an embodiment of the present disclosure, a method of fabricating an integrated circuit structure includes providing a substrate having a feature thereon. The method also includes forming a silicon layer on the feature, the silicon layer having a silicon purity of greater than 99%, and the silicon layer having a thickness. The method also includes forming a titanium layer on the silicon layer, the titanium layer having a thickness. A ratio of the thickness of the silicon layer to the thickness of the titanium layer is in the range of 2.2-2.4. The method also includes annealing the titanium layer and the silicon layer to form a layer including titanium and silicon. In an embodiment, the layer including titanium and silicon has a total atomic composition including 95% or greater stoichiometric TiSi$_2$ on the feature. In an embodiment, unreacted titanium remains following the annealing the titanium layer and the silicon layer, and the method further includes removing the unreacted titanium from the layer including titanium and silicon.

In an embodiment, the feature is an epitaxial source or drain structure, examples of which are described below in association with FIGS. 4A, 4B, 5A and 5B. In another embodiment, the feature is a conductive line trench of a back end-of-line (BEOL) metallization layer, and the layer including titanium and silicon is barrier layer for a conductive line, examples of which are described below in association with FIG. 6. In another embodiment, the feature is a gate trench of a semiconductor device, and the layer including titanium and silicon is a work-function layer of a metal gate electrode of the semiconductor device, examples of which are described below in association with FIGS. 7A and 7B.

FIGS. 3A1-3A4 illustrate cross-sectional views of various structures including a high purity silicon cap thereon, for ultimate reaction with a titanium layer, in accordance with an embodiment of the present disclosure.

Referring to FIG. 3A1, a starting structure includes silicon fins 302A1 having silicon or silicon germanium epitaxial source or drain structures 304A1 thereon (depicted as merged). The silicon or silicon germanium epitaxial source or drain structures 304A1 are confined between dielectric walls 306A1, such as gate end-cap dielectric walls, which may include a dielectric spacer 308A1 thereon. An epitaxial silicon layer 310A1 is formed on the silicon or silicon germanium epitaxial source or drain structures 304A1. The epitaxial silicon layer 310A1 has an "ideal" profile, which can be difficult to achieve.

Referring to FIG. 3A2, a starting structure includes silicon fins 302A2 having silicon or silicon germanium epitaxial source or drain structures 304A2 thereon (depicted as merged). The silicon or silicon germanium epitaxial source or drain structures 304A2 are confined between dielectric walls 306A2, such as gate end-cap dielectric walls, which may include a dielectric spacer 308A2 thereon. An epitaxial silicon layer 310A2 is formed on the silicon or silicon germanium epitaxial source or drain structures 304A2. The epitaxial silicon layer 310A2 has a non-uniform profile with a "too" thick middle and a "too" thin edge.

Referring to FIG. 3A3, a starting structure includes silicon fins 302A3 having silicon or silicon germanium epitaxial source or drain structures 304A3 thereon (depicted as merged). The silicon or silicon germanium epitaxial source or drain structures 304A3 are confined between dielectric walls 306A1, such as gate end-cap dielectric walls, which may include a dielectric spacer 308A3 thereon. An epitaxial silicon layer 310A3 is formed on the silicon or silicon germanium epitaxial source or drain structures 304A3. The epitaxial silicon layer 310A3 has a non-uniform profile with a constant and suitable thickness in the middle and a "too" thin edge.

Referring to FIG. 3A4, a starting structure includes silicon fins 302A4 having silicon or silicon germanium epitaxial source or drain structures 304A4 thereon (depicted as merged). The silicon or silicon germanium epitaxial source or drain structures 304A4 are confined between dielectric walls 306A4, such as gate end-cap dielectric walls, which may include a dielectric spacer 308A4 thereon. An epitaxial silicon layer 310A4 is formed on the silicon or silicon germanium epitaxial source or drain structures 304A4. The epitaxial silicon layer 310A4 has a uniform profile with a constant and suitable thickness in the middle and at the edge. In one embodiment, the epitaxial silicon layer 310A4 is suitable for forming a hermetic titanium di-silicide layer.

Figure 4A:
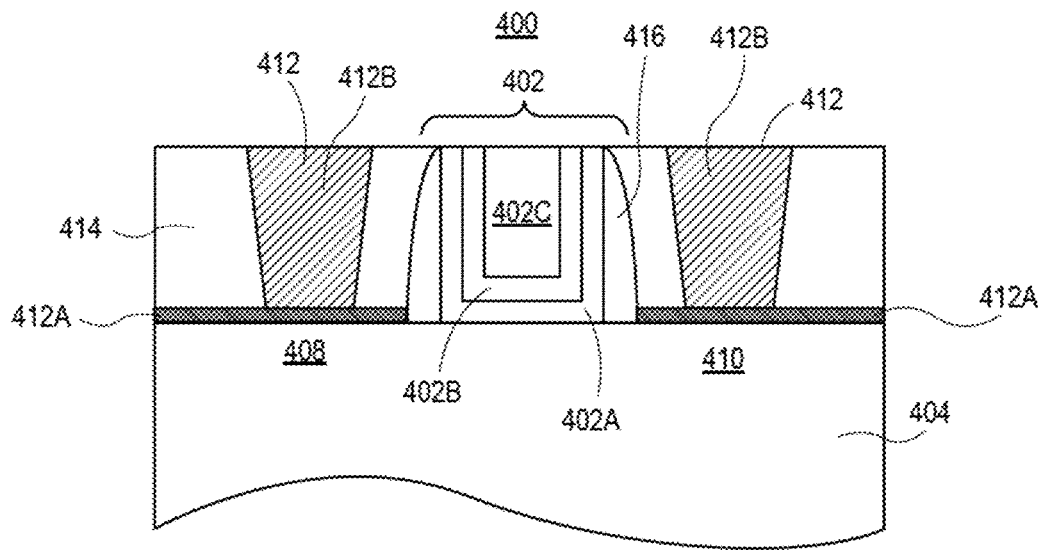
FIG. 4A illustrates a cross-sectional view of a semiconductor device having a titanium di-silicide ($TiSi_2$) layer on a source or drain region, in accordance with an embodiment of the present disclosure.
Figure 4B:
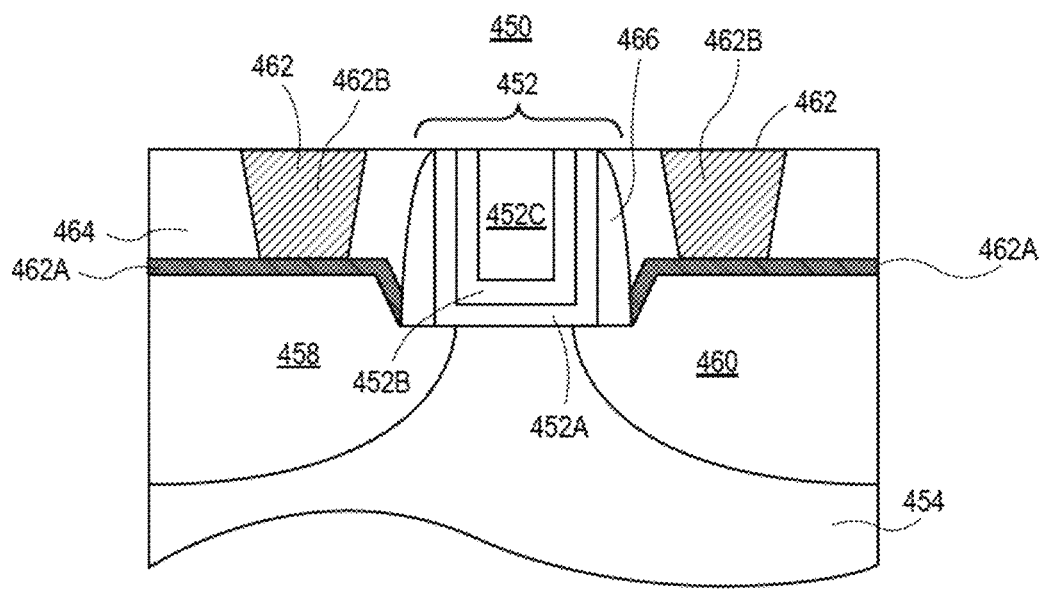
FIG. 4B illustrates a cross-sectional view of another semiconductor device having a titanium di-silicide ($TiSi_2$) layer on a raised source or drain region, in accordance with an embodiment of the present disclosure.

In another aspect, FIG. 4A illustrates a cross-sectional view of a semiconductor device having a titanium di-silicide (TiSi$_2$) layer on a source or drain region, in accordance with an embodiment of the present disclosure. FIG. 4B illustrates a cross-sectional view of another semiconductor device having a conductive on a raised source or drain region, in accordance with an embodiment of the present disclosure.

Referring to FIG. 4A, a semiconductor structure 400 includes a gate structure 402 above a substrate 404. The gate structure 402 includes a gate dielectric layer 402A, a work-function layer 402B, and a gate fill 402C. A source region 408 and a drain region 410 are on opposite sides of the gate structure 402. Source or drain contacts 412 are electrically connected to the source region 408 and the drain region 410, and are spaced apart of the gate structure 402 by one or both of an inter-layer dielectric layer 414 or gate dielectric spacers 416. The source region 408 and the drain region 410 are monocrystalline regions of the substrate 404. In an embodiment, the source or drain contacts 412 include a titanium di-silicide (TiSi$_2$) material layer 412A, such as described above in association with FIGS. 2A-2B and 3A-3E, and a conductive trench fill material 412B.

Referring to FIG. 4B, a semiconductor structure 450 includes a gate structure 452 above a substrate 454. The gate structure 452 includes a gate dielectric layer 452A, a work-function layer 452B, and a gate fill 452C. A source region 458 and a drain region 460 are on opposite sides of the gate structure 452. Source or drain contacts 462 are electrically connected to the source region 458 and the drain region 460, and are spaced apart of the gate structure 452 by one or both of an inter-layer dielectric layer 464 or gate dielectric spacers 466. The source region 458 and the drain region 460 are epitaxial and/or embedded material regions formed in etched-out regions of the substrate 454. As is depicted, in an embodiment, the source region 458 and the drain region 460 are raised source and drain regions. In a specific such embodiment, the raised source and drain regions are raised silicon source and drain regions or raised silicon germanium source and drain regions. In an embodiment, the source or drain contacts 462 include a titanium di-silicide (TiSi$_2$) material layer 462A, such as described above in association with FIGS. 2A-2B and 3A-3E, and a conductive trench fill material 462B.

Figure 5A:
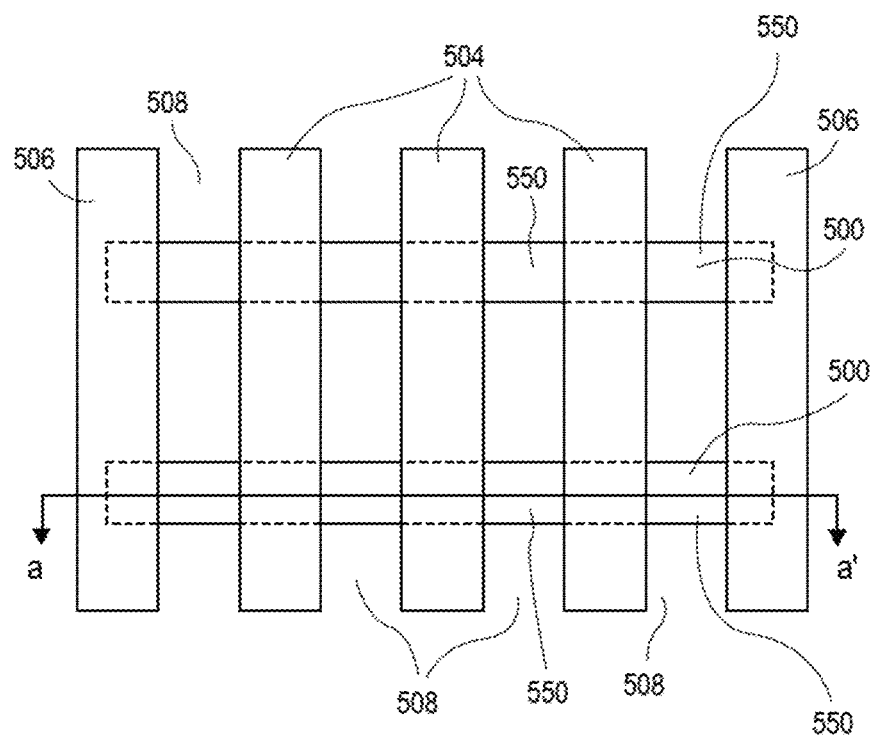
FIGS. 5A and 5B illustrate a plan view and a corresponding cross-sectional view, respectively, of a plurality of gate lines over a pair of semiconductor fins with intervening structures including a titanium di-silicide ($TiSi_2$) layer on a raised source or drain region, in accordance with an embodiment of the present disclosure.
Figure 5B:
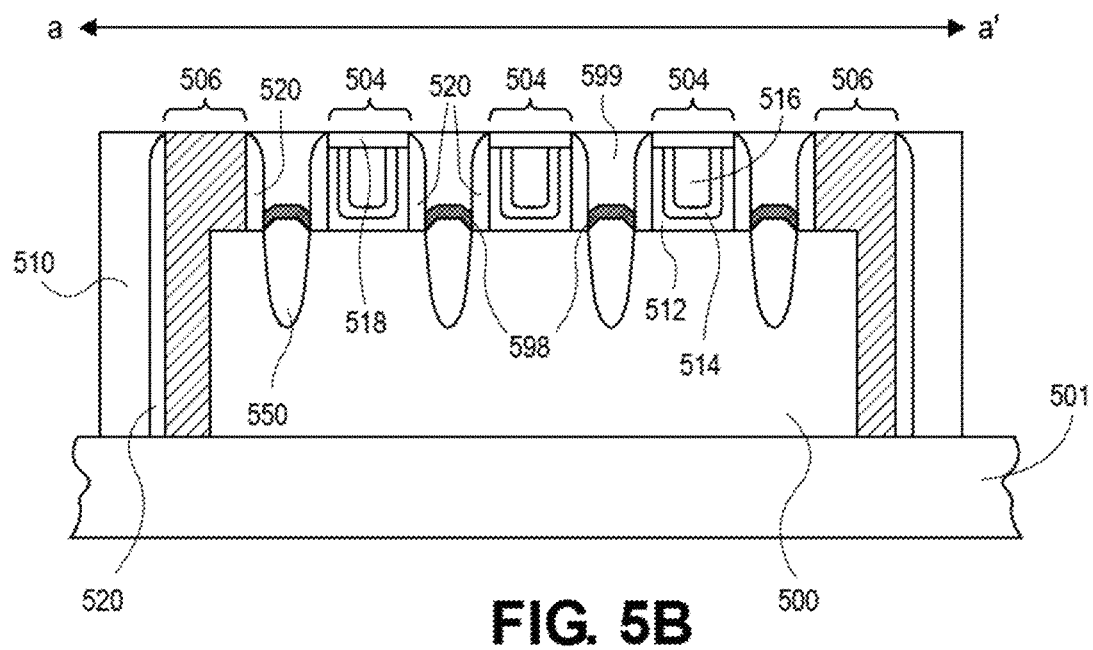

FIGS. 5A and 5B illustrate a plan view and a corresponding cross-sectional view, respectively, of a plurality of gate lines over a pair of semiconductor fins with intervening structures including a titanium di-silicide (TiSi$_2$) layer on a raised source or drain region, in accordance with an embodiment of the present disclosure.

Referring to FIGS. 5A and 5B, a plurality of active gate lines 504 is formed over a plurality of semiconductor fins 500 above a substrate 501. Dummy gate lines 506 are at the ends of the plurality of semiconductor fins 500. Spacings 508 between the gate lines 504/506 are locations where trench contacts may be formed as conductive contacts to source or drain regions, such as source or drain regions 550.

In an embodiment, the pattern of the plurality of gate lines 504/506 and/or the pattern of the plurality of semiconductor fins 500 is described as a grating structure. In an embodiment, the term "grating" for the plurality of gate lines 504/506 and/or the pattern of the plurality of semiconductor fins 500 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 504/506 and/or the pattern of the plurality of semiconductor fins 500 spaced at a constant pitch and having a constant width. The pattern may be fabricated by a pitch halving or pitch quartering, or other pitch division, approach.

Referring to FIG. 5B, a dielectric layer 510 is on outer ends of the structure. Embedded source or drain structures 550 are in the semiconductor fin 500 between adjacent ones of the active gate lines 504 and between the dummy gate lines 506 and the active gate lines 504. In one embodiment, the active gate lines 504 include a gate dielectric layer 512, a work-function gate electrode portion 514 and a fill gate electrode portion 516, and, possibly, a dielectric capping layer 518. Dielectric spacers 420 line the sidewalls of the active gate lines 504 and the dummy gate lines 506. In an embodiment, a titanium di-silicide (TiSi$_2$) material layer 598, such as described above in association with FIGS. 2A-2B and 3A-3E, is on each of the source or drain structures 550. Trench contacts 599 are between the active gate lines 504 and between the dummy gate lines 506 and the active gate lines 504. Trench contacts 599 may include a conductive liner and a conductive fill, or only a conductive fill.

With reference again to FIG. 5B, in accordance with an embodiment of the present disclosure, an integrated circuit structure includes a semiconductor fin 500 above a substrate 501, the semiconductor fin having a top and sidewalls. A gate electrode (one 504) is over the top and adjacent to the sidewalls of a portion of the semiconductor fin 500, the gate electrode 504 defining a channel region in the semiconductor fin 500. A first epitaxial semiconductor source or drain structure (first 550) is at a first end of the channel region at a first side of the gate electrode 504, the first epitaxial semiconductor 550 source or drain structure having a non-flat topography. A second epitaxial semiconductor source or drain structure (second 550) is at a second end of the channel region at a second side of the gate electrode 504, the second end opposite the first end, the second side opposite the first side, and the second epitaxial semiconductor source or drain structure (second 550) having a non-flat topography. A titanium silicide material 598 is in direct contact with each of the first and second epitaxial semiconductor source or drain structures 550.

In an embodiment, the titanium silicide material is conformal with and hermetically sealing the non-flat topography of each of the first and second epitaxial semiconductor source or drain structures 550. In one embodiment, the titanium silicide material 598 has a total atomic composition including 95% or greater stoichiometric TiSi$_2$. In a specific such embodiment, the titanium silicide material 598 has a total atomic composition including 98% or greater of stoichiometric TiSi$_2$.

In an embodiment, the total atomic composition of titanium silicide material 598 further includes a non-zero amount but less than 1% of phosphorous, boron or germanium. In an embodiment, the titanium silicide material 598 has a C49 crystalline phase or a C54 crystalline phase. In an embodiment, the titanium silicide material has a thickness variation of 10% or less along the non-flat topography of each of the first and second epitaxial semiconductor source or drain structures.

In an embodiment, the non-flat topography of each of the first and second epitaxial semiconductor source or drain structures 550 includes a raised central portion and lower side portions, a non-limiting example of which is depicted in FIG. 5B. In an embodiment, the first epitaxial semiconductor source or drain structure 550 and the second epitaxial semiconductor source or drain structure 550 both include silicon. In one such embodiment, the first epitaxial semiconductor source or drain structure 550 and the second epitaxial semiconductor source or drain structure 550 both further include germanium.

In another aspect, FIG. 6 illustrates a plan view and corresponding cross-sectional view of a metallization layer of an integrated circuit structure, in accordance with an embodiment of the present disclosure.

Referring to FIG. 6, a metallization layer 600 includes a pattern of conductive lines 602 and interlayer dielectric (ILD) lines 604. The metallization layer 600 may be patterned in a grating-like pattern with conductive lines 602 spaced at a constant pitch and having a constant width, as is depicted in FIG. 6. Although not shown, the conductive lines 602 may have interruptions (i.e., cuts or plugs) at various locations along the lines. Some of the conductive lines may be associated with underlying vias, such as line 602' shown as an example in the cross-sectional view.

In an embodiment, the term "grating" for conductive lines 602 and ILD lines 604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 602 and/or ILD lines 604 spaced at a constant pitch and having a constant width. The pattern may be fabricated by a pitch halving or pitch quartering, or other pitch division, approach.

In an embodiment, the conductive lines 602 (and, possibly, underlying via structures) are composed of one or more metal or other conductive structures. The conductive lines 602 are also sometimes referred to in the art as traces, wires, lines, metal, interconnect lines or simply interconnects. In a particular embodiment, each of the conductive lines 602 includes a barrier layer 612 and a conductive fill material 610.

In an embodiment, the titanium di-silicide ($TiSi_2$) material layer 610, such as described above in association with FIGS. 2A-2B and 3A-3E. In an embodiment, the conductive fill material 610 is composed of a conductive material such as, but not limited to, Cu, Al, Ti, Zr, Hf, V, Ru, Co, Ni, Pd, Pt, W, Ag, Au or alloys thereof.

In an embodiment, ILD lines 604 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the art, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 6 may be fabricated on underlying lower level back end of line (BEOL) interconnect layers.

Figure 7A:
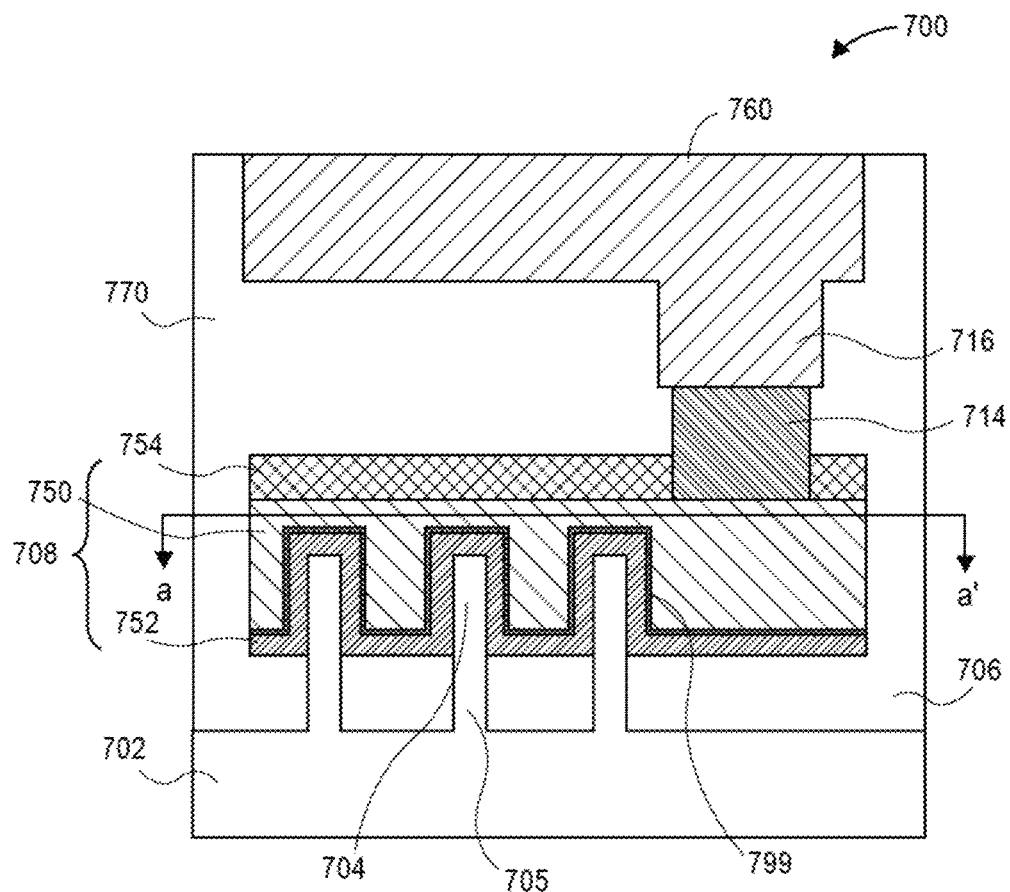
FIG. 7A illustrates a cross-sectional view of a non-planar semiconductor device having a titanium di-silicide ($TiSi_2$) layer as a work-function layer of a gate electrode, in accordance with an embodiment of the present disclosure.
Figure 7B:
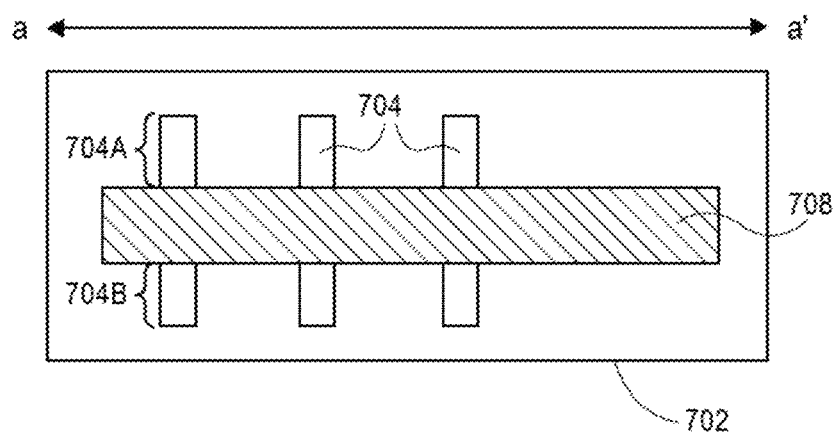
FIG. 7B illustrates a plan view taken along the a-a' axis of the semiconductor device of FIG. 7A, in accordance with an embodiment of the present disclosure.

In another aspect, one or more embodiments described herein are directed to fabricating semiconductor devices, such as for metal oxide semiconductor (MOS) device fabrication. As an example, FIG. 7A illustrates a cross-sectional view of a non-planar semiconductor device having a titanium di-silicide ($TiSi_2$) layer as a work-function layer of a gate electrode, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750/799 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

In accordance with an embodiment of the present disclosure, the layer 799 of gate electrode 750/799 is a titanium di-silicide ($TiSi_2$) material layer, such as described above in association with FIGS. 2A-2B and 3A-3E. In one embodiment, the titanium di-silicide ($TiSi_2$) material layer 799 is in a gate trench, and is on or above gate dielectric layer 752. In one such embodiment, the titanium di-silicide ($TiSi_2$) material layer 799 is a work-function layer of a metal gate electrode of a transistor 700 of the integrated circuit structure. In a particular embodiment, the transistor 700 is an N-type (NMOS) transistor or is a P-type (PMOS) transistor.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 752, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, antimony, boron, gallium or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon monocrystalline substrate. Bulk substrate 702 may alternatively be composed of a group III-V material. In an embodiment, bulk substrate 702 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a group III-V material and the charge-carrier dopant impurity atoms are ones such as, but not limited to, magnesium, beryllium, zinc, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

In an embodiment, the gate dielectric layer 752 is composed of a high-k material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 752 may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, layer 750 of the gate electrode 750/799 is composed of a non-work-function-setting conductive fill material formed above the titanium di-silicide ($TiSi_2$) material layer 799. In one such embodiment, the conductive fill material 750 includes a material such as but not limited to, tungsten (W), aluminum (Al), or copper (Cu). In one embodiment, one or more conductive barrier layers (such as titanium nitride or tantalum nitride) is between layers 750 and 799 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 754 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 754 and/or dielectric spacers are composed of a dielectric material such as, but not limited to, silicon dioxide, silicon oxy-nitride, silicon nitride, or carbon-doped silicon nitride.

Gate contact 714, overlying gate contact via 716, and/or overlying metal interconnect 760 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 714, overlying gate contact via 716, or overlying metal interconnect 760 includes a barrier layer and a conductive fill material. In one such embodiment, the barrier layer is a titanium di-silicide ($TiSi_2$) material layer, such as described above. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material, or only a conductive fill material. In an embodiment, the trench contacts are formed on a titanium di-silicide ($TiSi_2$) material layer formed on the source or drain structures. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET device, a nanowire device, or a nanoribbon device. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the art. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
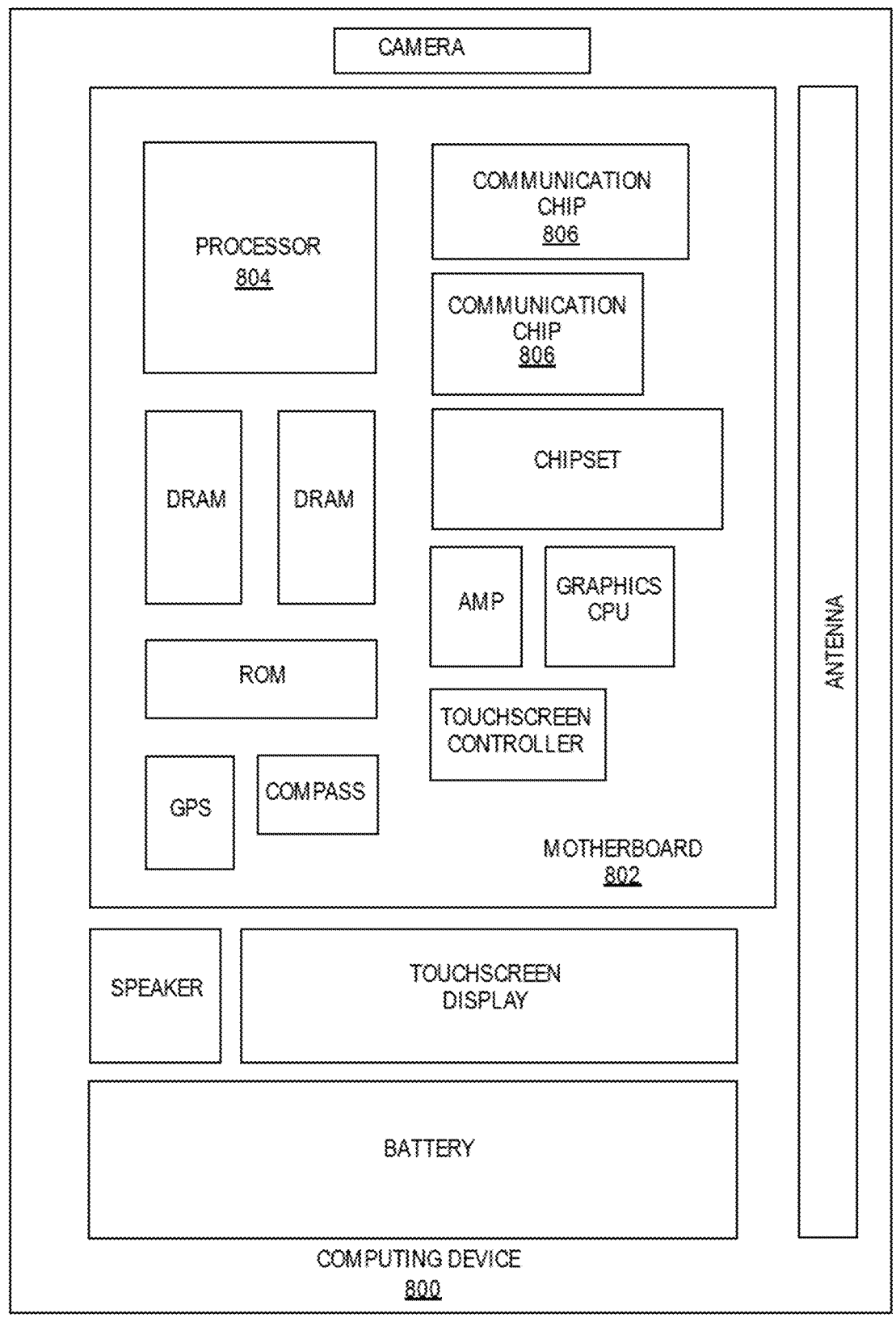
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more structures fabricated to include a titanium di-silicide (TiSi$_2$) material layer, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more structures fabricated to include a titanium di-silicide (TiSi$_2$) material layer, in accordance with implementations of embodiments of the disclosure.

In further implementations, another component housed within the computing device 800 may contain an integrated circuit die that includes one or more structures fabricated to include a titanium di-silicide (TiSi$_2$) material layer, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
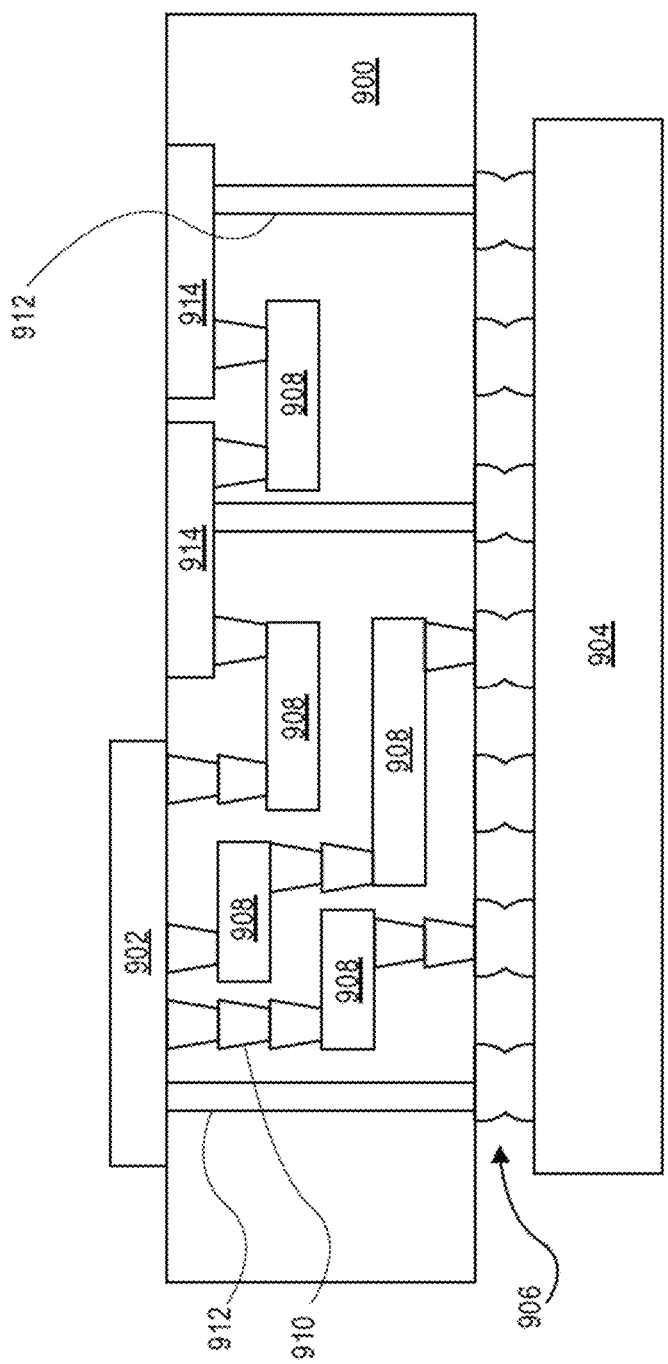
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments described herein include approaches for fabricating an integrated circuit structure including a titanium silicide material, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor fin above a substrate, the semiconductor fin having a top and sidewalls. A gate electrode is over the top and adjacent to the sidewalls of a portion of the semiconductor fin, the gate electrode defining a channel region in the semiconductor fin. A first epitaxial semiconductor source or drain structure is at a first end of the channel region at a first side of the gate electrode, the first epitaxial semiconductor source or drain structure having a non-flat topography. A second epitaxial semiconductor source or drain structure is at a second end of the channel region at a second side of the gate electrode, the second end opposite the first end, the second side opposite the first side, and the second epitaxial semiconductor source or drain structure having a non-flat topography. A titanium silicide material is in direct contact with each of the first and second epitaxial semiconductor source or drain structures. The titanium silicide material is conformal with and hermetically sealing the non-flat topography of each of the first and second epitaxial semiconductor source or drain structures. The titanium silicide material has a total atomic composition including 95% or greater stoichiometric TiSi$_2$.

Example embodiment 2: The integrated circuit structure of example embodiment 1, wherein the titanium silicide material has a total atomic composition including 98% or greater of stoichiometric TiSi$_2$.

Example embodiment 3: The integrated circuit structure of example embodiment 1 or 2, wherein the total atomic composition of titanium silicide material further includes a non-zero amount but less than 1% of phosphorous, boron or germanium.

Example embodiment 4: The integrated circuit structure of example embodiment 1, 2 or 3, wherein the titanium silicide material has a C49 crystalline phase or a C54 crystalline phase.

Example embodiment 5: The integrated circuit structure of example embodiment 1, 2, 3 or 4, wherein the titanium silicide material has a thickness variation of 10% or less along the non-flat topography of each of the first and second epitaxial semiconductor source or drain structures.

Example embodiment 6: The integrated circuit structure of example embodiment 1, 2, 3, 4 or 5, wherein the non-flat topography of each of the first and second epitaxial semiconductor source or drain structures includes a raised central portion and lower side portions.

Example embodiment 7: The integrated circuit structure of example embodiment 1, 2, 3, 4, 5 or 6, wherein the first epitaxial semiconductor source or drain structure and the second epitaxial semiconductor source or drain structure both include silicon.

Example embodiment 8: The integrated circuit structure of example embodiment 7, wherein the first epitaxial semiconductor source or drain structure and the second epitaxial semiconductor source or drain structure both further include germanium.

Example embodiment 9: The integrated circuit structure of example embodiment 1, 2, 3, 4, 5, 6, 7 or 8, further including a conductive fill material on the titanium silicide material.

Example embodiment 10: The integrated circuit structure of example embodiment 1, 2, 3, 4, 5, 6, 7, 8 or 9, further including a second semiconductor fin having a top and sidewalls. The gate electrode is further over the top and adjacent to the sidewalls of a portion of the second semiconductor fin, the gate electrode defining a channel region in the second semiconductor fin. A third epitaxial semiconductor source or drain structure is at a first end of the channel region of the second semiconductor fin at the first side of the gate electrode, the third epitaxial semiconductor source or drain structure having a non-flat topography. A fourth epitaxial semiconductor source or drain structure is at a second end of the channel region of the second semiconductor fin at the second side of the gate electrode, the second end opposite the first end, and the fourth epitaxial semiconductor source or drain structure having a non-flat topography. The titanium silicide material is in direct contact with each of the third and fourth epitaxial semiconductor source or drain structures. The titanium silicide material is conformal with and hermetically sealing the non-flat topography of each of the third and fourth epitaxial semiconductor source or drain structures. The titanium silicide material is continuous between the first and third epitaxial semiconductor source or drain structures and continuous between the second and fourth epitaxial semiconductor source or drain structures.

Example embodiment 11: A method of fabricating an integrated circuit structure includes providing a substrate having a feature thereon. The method also includes forming a silicon layer on the feature, the silicon layer having a silicon purity of greater than 99%, and the silicon layer having a thickness. The method also includes forming a titanium layer on the silicon layer, the titanium layer having a thickness. A ratio of the thickness of the silicon layer to the thickness of the titanium layer is in the range of 2.2-2.4. The method also includes annealing the titanium layer and the silicon layer to form a layer including titanium and silicon. The layer including titanium and silicon has a total atomic composition including 95% or greater stoichiometric $TiSi_2$ on the feature.

Example embodiment 12: The method of example embodiment 11, wherein unreacted titanium remains following the annealing the titanium layer and the silicon layer, and the method further includes removing the unreacted titanium from the layer including titanium and silicon.

Example embodiment 13: The method of example embodiment 11 or 12, wherein the feature is an epitaxial source or drain structure.

Example embodiment 14: The method of example embodiment 11 or 12, wherein the feature is a conductive line trench of a back end-of-line (BEOL) metallization layer, and wherein the layer including titanium and silicon is barrier layer for a conductive line.

Example embodiment 15: The method of example embodiment 11 or 12, wherein the feature is a gate trench of a semiconductor device, and wherein the layer including titanium and silicon is a work-function layer of a metal gate electrode of the semiconductor device.

Example embodiment 16: A computing device includes a board and a component coupled to the board. The component includes an integrated circuit structure. The integrated circuit structure includes a semiconductor fin above a substrate, the semiconductor fin having a top and sidewalls. A gate electrode is over the top and adjacent to the sidewalls of a portion of the semiconductor fin, the gate electrode defining a channel region in the semiconductor fin. A first epitaxial semiconductor source or drain structure is at a first end of the channel region at a first side of the gate electrode, the first epitaxial semiconductor source or drain structure having a non-flat topography. A second epitaxial semiconductor source or drain structure is at a second end of the channel region at a second side of the gate electrode, the second end opposite the first end, the second side opposite the first side, and the second epitaxial semiconductor source or drain structure having a non-flat topography. A titanium silicide material is in direct contact with each of the first and second epitaxial semiconductor source or drain structures. The titanium silicide material is conformal with and hermetically sealing the non-flat topography of each of the first and second epitaxial semiconductor source or drain structures. The titanium silicide material has a total atomic composition including 95% or greater stoichiometric $TiSi_2$.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, further including a battery coupled to the board.

Example embodiment 21: The computing device of example embodiment 16, 17, 18, 19 or 20, further including an antenna coupled to the board.

Example embodiment 22: The computing device of example embodiment 16, 17, 18, 19, 20 or 21, wherein the component is a packaged integrated circuit die.

What is claimed is:
1. An integrated circuit structure, comprising:
a nanowire;

a gate electrode surrounding a channel region of the nanowire;

a first epitaxial semiconductor source or drain structure at a first end of the channel region at a first side of the gate electrode, the first epitaxial semiconductor source or drain structure having a non-flat topography;

a first dielectric spacer in contact with a side of the first epitaxial semiconductor source or drain structure;

a second epitaxial semiconductor source or drain structure at a second end of the channel region at a second side of the gate electrode, the second end opposite the first end, the second side opposite the first side, and the second epitaxial semiconductor source or drain structure having a non-flat topography;

a second dielectric spacer in contact with a side of the second epitaxial semiconductor source or drain structure;

a titanium silicide material in direct contact with each of the first and second epitaxial semiconductor source or drain structures and with each of the first and second dielectric spacers, the titanium silicide material conformal with and hermetically sealing the non-flat topography of each of the first and second epitaxial semiconductor source or drain structures, and the titanium silicide material having a total atomic composition comprising 95% or greater stoichiometric $TiSi_2$; and a dielectric wall adjacent to the first dielectric spacer, wherein the first dielectric spacer is laterally between the dielectric wall and the first epitaxial semiconductor source or drain structure, and wherein the dielectric wall is in contact with the first dielectric spacer and in contact with the titanium silicide material.

2. The integrated circuit structure of claim 1, wherein the titanium silicide material has a total atomic composition comprising 98% or greater of stoichiometric $TiSi_2$.

3. The integrated circuit structure of claim 1, wherein the total atomic composition of titanium silicide material further comprises a non-zero amount but less than 1% of phosphorous, boron or germanium.

4. The integrated circuit structure of claim 1, wherein the titanium silicide material has a C49 crystalline phase or a C54 crystalline phase.

5. The integrated circuit structure of claim 1, wherein the titanium silicide material has a thickness variation of 10% or less along the non-flat topography of each of the first and second epitaxial semiconductor source or drain structures.

6. The integrated circuit structure of claim 1, wherein the non-flat topography of each of the first and second epitaxial semiconductor source or drain structures comprises a raised central portion and lower side portions.

7. The integrated circuit structure of claim 1, wherein the first epitaxial semiconductor source or drain structure and the second epitaxial semiconductor source or drain structure both comprise silicon.

8. The integrated circuit structure of claim 7, wherein the first epitaxial semiconductor source or drain structure and the second epitaxial semiconductor source or drain structure both further comprise germanium.

9. The integrated circuit structure of claim 1, further comprising:

a conductive fill material on the titanium silicide material.

10. The integrated circuit structure of claim 1, further comprising:

a second nanowire, wherein the gate electrode further surrounds a channel region of the second nanowire;

a third epitaxial semiconductor source or drain structure at a first end of the channel region of the second nanowire at the first side of the gate electrode, the third epitaxial semiconductor source or drain structure having a non-flat topography; and a fourth epitaxial semiconductor source or drain structure at a second end of the channel region of the second nanowire at the second side of the gate electrode, the second end opposite the first end, the fourth epitaxial semiconductor source or drain structure having a non-flat topography, wherein the titanium silicide material is in direct contact with each of the third and fourth epitaxial semiconductor source or drain structures, the titanium silicide material conformal with and hermetically sealing the non-flat topography of each of the third and fourth epitaxial semiconductor source or drain structures, and the titanium silicide material continuous between the first and third epitaxial semiconductor source or drain structures and continuous between the second and fourth epitaxial semiconductor source or drain structures.

11. A computing device, comprising:

a board; and a component coupled to the board, the component including an integrated circuit structure, comprising:

a nanowire;

a gate electrode surrounding a channel region of the nanowire;

a first epitaxial semiconductor source or drain structure at a first end of the channel region at a first side of the gate electrode, the first epitaxial semiconductor source or drain structure having a non-flat topography;

a first dielectric spacer in contact with a side of the first epitaxial semiconductor source or drain structure;

a second epitaxial semiconductor source or drain structure at a second end of the channel region at a second side of the gate electrode, the second end opposite the first end, the second side opposite the first side, the second epitaxial semiconductor source or drain structure having a non-flat topography;

a second dielectric spacer in contact with a side of the second epitaxial semiconductor source or drain structure;

a titanium silicide material in direct contact with each of the first and second epitaxial semiconductor source or drain structures and with each of the first and second dielectric spacers, the titanium silicide material conformal with and hermetically sealing the non-flat topography of each of the first and second epitaxial semiconductor source or drain structures, and the titanium silicide material; and a dielectric wall adjacent to the first dielectric spacer, wherein the first dielectric spacer is laterally between the dielectric wall and the first epitaxial semiconductor source or drain structure, and wherein the dielectric wall is in contact with the first dielectric spacer and in contact with the titanium silicide material.

12. The computing device of claim 11, further comprising:

a memory coupled to the board.

13. The computing device of claim 11, further comprising:

a communication chip coupled to the board.

14. The computing device of claim 11, further comprising:

a camera coupled to the board.

15. The computing device of claim 11, further comprising:
a battery coupled to the board.

16. The computing device of claim 11, further comprising:
an antenna coupled to the board.

17. The computing device of claim 11, further comprising:
a display coupled to the board.

18. The computing device of claim 11, wherein the titanium silicide material of the integrated circuit structure has a total atomic composition comprising 98% or greater of stoichiometric $TiSi_2$.

19. The computing device of claim 11, wherein the total atomic composition of titanium silicide material of the integrated circuit structure further comprises a non-zero amount but less than 1% of phosphorous, boron or germanium.

20. The computing device of claim 11, wherein the component is a packaged integrated circuit die.

* * * * *